United States Patent
Anderl et al.

(10) Patent No.: US 9,213,378 B2
(45) Date of Patent: Dec. 15, 2015

(54) COOLING SYSTEM FOR ELECTRONIC COMPONENTS

(71) Applicant: International Business Machines Corporation, Armonk, NY (US)

(72) Inventors: William James Anderl, Rochester, MN (US); Evan George Colgan, Chestnut Ridge, NY (US); James Dorance Gerken, Zumbro Falls, MN (US); Christopher Michael Marroquin, Rochester, MN (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 13/781,837

(22) Filed: Mar. 1, 2013

(65) Prior Publication Data
US 2013/0176679 A1    Jul. 11, 2013

Related U.S. Application Data

(63) Continuation of application No. 12/417,921, filed on Apr. 3, 2009.

(51) Int. Cl.
*H05K 7/20* (2006.01)
*G06F 1/20* (2006.01)
*H01L 23/40* (2006.01)
*H01L 23/473* (2006.01)

(52) U.S. Cl.
CPC ............ *G06F 1/206* (2013.01); *H01L 23/4093* (2013.01); *H01L 23/473* (2013.01); *H01L 2924/0002* (2013.01)

(58) Field of Classification Search
USPC .................................. 361/702, 699
See application file for complete search history.

(56) References Cited

U.S. PATENT DOCUMENTS

| | | |
|---|---|---|
| 3,874,443 A | 4/1975 | Bayer |
| 3,917,370 A | 11/1975 | Thornton et al. |
| 4,009,423 A | 2/1977 | Wilson |
| 4,093,971 A | 6/1978 | Chu et al. |
| 4,315,300 A | 2/1982 | Parmerlee et al. |
| 4,962,444 A | 10/1990 | Niggemann |
| 5,050,037 A | 9/1991 | Yamamoto et al. |
| 5,057,968 A | 10/1991 | Morrison |
| 5,339,214 A | 8/1994 | Nelson |
| 5,398,748 A | 3/1995 | Yamaji et al. |
| 5,829,516 A | 11/1998 | Lavochkin |

(Continued)

OTHER PUBLICATIONS

Charmaine Moyer, "Octane Workstation Owner's Guide," Document No. 007-3435-004, 1997-2002, Silicon Graphics, Inc.

(Continued)

*Primary Examiner* — Andargie M Aychillhum
(74) *Attorney, Agent, or Firm* — Matthew C. Zehrer; Roy W. Truelson

(57) ABSTRACT

Embodiments of the present invention provide for non interruptive fluid cooling of an electronic enclosure. One or more electronic component packages may be removable from a circuit card having a fluid flow system. When installed, the electronic component packages are coincident to and in a thermal relationship with the fluid flow system. If a particular electronic component package becomes non-functional, it may be removed from the electronic enclosure without affecting either the fluid flow system or other neighboring electronic component packages.

13 Claims, 4 Drawing Sheets

(56) References Cited

U.S. PATENT DOCUMENTS

| | | |
|---|---|---|
| 6,065,208 A | 5/2000 | Lamb et al. |
| 6,111,749 A | 8/2000 | Lamb et al. |
| 6,119,765 A | 9/2000 | Lee |
| 6,233,150 B1 | 5/2001 | Lin et al. |
| 6,297,966 B1 | 10/2001 | Lee et al. |
| 6,349,035 B1 | 2/2002 | Koenen |
| 6,449,156 B1 | 9/2002 | Han et al. |
| 6,639,798 B1 | 10/2003 | Jeter et al. |
| 6,748,350 B2 | 6/2004 | Rumer et al. |
| 6,888,719 B1 | 5/2005 | Janzen et al. |
| 7,019,974 B2 | 3/2006 | Lee et al. |
| 7,100,506 B2 | 9/2006 | Takeda |
| 7,106,595 B2 | 9/2006 | Foster et al. |
| 7,151,668 B1 | 12/2006 | Stathakis |
| 7,289,327 B2 | 10/2007 | Goodwin et al. |
| 7,342,797 B2 | 3/2008 | Kamath et al. |
| 7,400,506 B2 | 7/2008 | Hoss et al. |
| 7,450,384 B2 | 11/2008 | Tavassoli et al. |
| 7,457,122 B2 | 11/2008 | Lai et al. |
| 7,460,367 B2 | 12/2008 | Tracewell et al. |
| 7,471,514 B2 | 12/2008 | Chen |
| 7,679,913 B2 | 3/2010 | Hsieh |
| 7,715,197 B2 | 5/2010 | Tian et al. |
| 7,755,897 B2 | 7/2010 | Chen et al. |
| 7,839,643 B1 | 11/2010 | Yu |
| 7,990,699 B2 | 8/2011 | Lian et al. |
| 8,004,841 B2 | 8/2011 | Cipolla et al. |
| 8,081,473 B2 | 12/2011 | Cipolla et al. |
| 2003/0026076 A1 | 2/2003 | Wei |
| 2004/0201963 A1 | 10/2004 | Garner |
| 2005/0103473 A1 | 5/2005 | Todd et al. |
| 2005/0141199 A1 | 6/2005 | Chiou et al. |
| 2006/0050483 A1 | 3/2006 | Wilson et al. |
| 2006/0067054 A1 | 3/2006 | Wang et al. |
| 2006/0098409 A1 | 5/2006 | Cheon |
| 2006/0203454 A1 | 9/2006 | Chang |
| 2006/0250765 A1 | 11/2006 | Yamabuchi et al. |
| 2006/0268519 A1 | 11/2006 | Bartley et al. |
| 2007/0097627 A1 | 5/2007 | Taylor et al. |
| 2007/0206359 A1 | 9/2007 | Lai et al. |
| 2007/0217153 A1 | 9/2007 | Lai et al. |
| 2007/0217160 A1 | 9/2007 | Legen et al. |
| 2007/0223198 A1 | 9/2007 | Lai et al. |
| 2007/0230127 A1 | 10/2007 | Peugh et al. |
| 2007/0263359 A1 | 11/2007 | Lai et al. |
| 2007/0263360 A1 | 11/2007 | Lai et al. |
| 2008/0062652 A1 | 3/2008 | Lieberman et al. |
| 2008/0101036 A1 | 5/2008 | Chen |
| 2008/0130240 A1 | 6/2008 | Wang et al. |
| 2008/0151487 A1 | 6/2008 | Ni et al. |
| 2008/0151505 A1 | 6/2008 | Chen et al. |
| 2008/0251911 A1 | 10/2008 | Farnsworth et al. |
| 2008/0259567 A1 | 10/2008 | Campbell et al. |
| 2008/0264613 A1 | 10/2008 | Chu |
| 2008/0273307 A1 | 11/2008 | Campbell et al. |
| 2008/0289798 A1 | 11/2008 | Min et al. |
| 2008/0291630 A1 | 11/2008 | Monh et al. |
| 2009/0002951 A1 | 1/2009 | Legen et al. |
| 2009/0034327 A1 | 2/2009 | Yun et al. |
| 2009/0190303 A1 | 7/2009 | Chu et al. |
| 2009/0268408 A1 | 10/2009 | Liu et al. |
| 2010/0085712 A1* | 4/2010 | Hrehor et al. ................ 361/699 |

OTHER PUBLICATIONS

United States Office Action dated Dec. 27, 2010, received in related U.S. Appl. No. 12/185,520.

\* cited by examiner

COOLING SYSTEM FOR ELECTRONIC COMPONENTS

CROSS REFERENCE TO RELATED APPLICATIONS

This application is a continuation of pending U.S. patent application Ser. No. 12/417,921, filed Apr. 3, 2009, entitled "Cooling System for Electronic Components", which is herein incorporated by reference. This application claims priority under 35 U.S.C. §120 of U.S. patent application Ser. No. 12/417,921, filed Apr. 3, 2009.

This application is also related to commonly-owned, co-pending U.S. patent application Ser. No. 12/115,618 filed on May 6, 2008, and to commonly-owned co-pending U.S. patent application Ser. No. 12/185,520 filed on Aug. 4, 2008, the entire contents and disclosures of which are expressly incorporated by reference in their entirety.

This invention was made with Government support under Contract No.: B554331 awarded by Department of Energy. The Government has certain rights in this invention.

FIELD OF THE INVENTION

The present invention relates generally to cooling an electronic enclosure, and more specifically relates to fluid cooling of electronic component packages being removable from the electronic enclosure, where the fluid cooling need not be interrupted when the electronic component package is removed.

BACKGROUND OF THE INVENTION

Electronic system components (e.g., central processing units (CPUs), graphics cards, hard drives, memory, etc.) generate large amounts of heat during operation. This heat must be removed from the components in order to maintain safe operating temperatures. Overheated parts generally exhibit a shorter maximum life-span and may be likely to experience sporadic problems resulting in system freezes or crashes. The typical heat removal technique adds heat dissipating elements to hot surfaces thereby increasing the area of heat dissipation. In many instances fans, or other active cooling devices, exchange the heated air or liquid with cooler ambient air or liquid.

In electronic systems utilizing liquid cooling, an electronic component may be permanently affixed to a cold plate which is part of a liquid moving structure that allows for the exchange of heated liquid with cooled liquid. In some instances many different electronic components are cooled with a single cold plate. Because of the permanent or semi-permanent connection between a cold plate and an electronic component, access to the electronic component and/or the removal of the electronic component is difficult. Further when multiple electronic components are cooled with a single cold plate, otherwise operable electronic components must be rendered inoperable in order to access and/or remove a damaged or defective electronic component.

SUMMARY OF THE INVENTION

The present invention provides for non interruptive fluid cooling of an electronic enclosure. One or more electronic component packages may be removable from a circuit card having a fluid flow system. When installed, the electronic component packages are coincident to and in a thermal relationship with the fluid flow system. If a particular electronic component package becomes non-functional, it may be removed from the electronic enclosure without affecting either the fluid flow system or other neighboring electronic component packages.

BRIEF DESCRIPTION OF THE DRAWINGS

Various embodiments of the present invention are hereinafter described in conjunction with the appended drawings.

It is to be noted, however, that the appended drawings illustrate only example embodiments of the invention, and are therefore not considered limiting of its scope, for the invention may admit to other equally effective embodiments.

DETAILED DESCRIPTION

Embodiments of the present invention provides for non interruptive fluid cooling of electrical components within an electronic enclosure. One or more electronic component packages may be removable from a circuit card having a fluid flow system. When installed, the electronic component packages are coincident to and in a thermal relationship with the fluid flow system. If a particular electronic component package becomes non-functional, it may be removed from the electronic enclosure without affecting either the fluid flow system or other neighboring electronic component packages.

For a better understanding of the present invention, together with other and further features and advantages thereof, reference is made to the following description, taken in conjunction with the accompanying drawings, and the scope of the invention will be pointed out in the appended claims.

It will be readily understood that the components of the present invention, as generally described and illustrated in the Figures herein, may be arranged and designed in a wide variety of different configurations. Thus, the following more detailed description of the embodiments of the apparatus, system, and method of the present invention, as represented in FIGS. 1 through 7, is not intended to limit the scope of the invention, as claimed, but is merely representative of selected embodiments of the invention.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

The illustrated embodiments of the invention will be best understood by reference to the drawings, wherein like parts are designated by like numerals or other labels throughout. The following description is intended only by way of example, and simply illustrates certain selected embodiments of devices, systems, and processes that are consistent with the invention as claimed herein.

Figure 1:
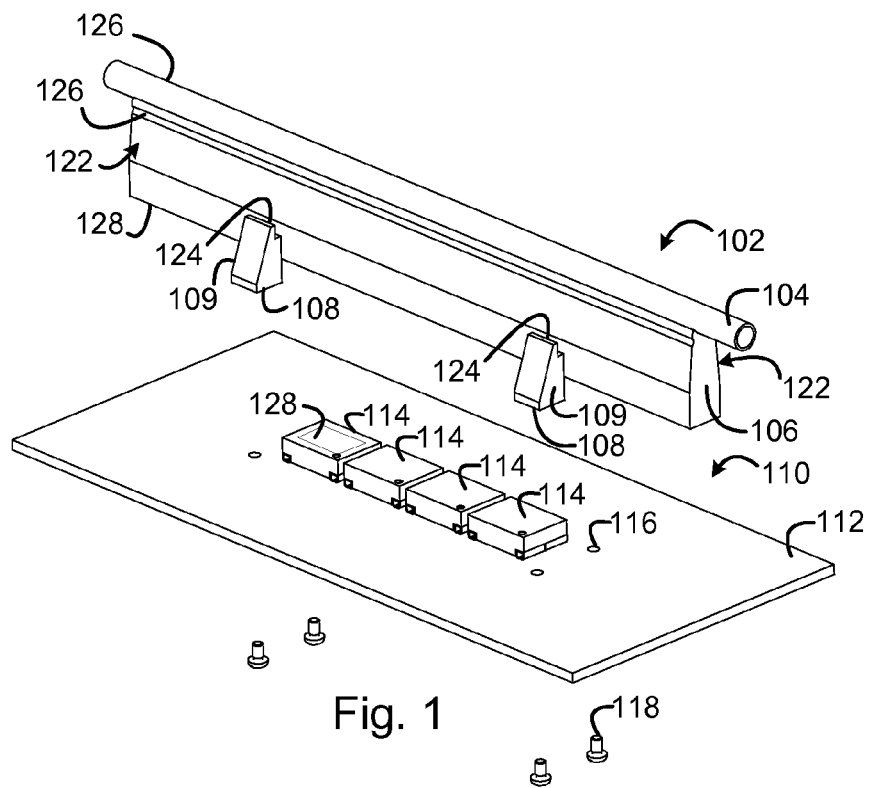
FIG. 1 depicts an exploded isometric view of a portion of circuit board and a portion of a fluid flow system according to an embodiment of the present invention.

FIG. 1 depicts an exploded isometric view of a portion of circuit board 110 and a portion of a fluid flow system 102 according to an embodiment of the present invention. Circuit board 110 is used to mechanically support and provide for electrical connections to and from electronic components using conductive pathways (not shown), or traces, etched from copper sheets laminated onto a non-electrically conductive substrate 112. Circuit board 110 may be a motherboard or a backplane. A motherboard is the central printed circuit board in an electronic system or enclosure. It is also known as a mainboard, system board, logic board, etc. A motherboard provides the electrical connections by which the other components of the system communicate, but unlike a backplane also contains the central processing unit and other subsystems such as the real time clock, and peripheral interfaces. Circuit board 110 may also be a backplane such as a passive or active backplane. A backplane is a circuit board that connects several connectors in parallel to each other, so that each pin of each connector is linked to the same relative pin of all the other connectors, forming a computer bus.

Circuit board 110 may comprise electrical component(s) 114 that generate heat. Electrical component(s) 114 may be for example a DC-DC power converter, DC voltage regulator, current multiplier, other power distribution and regulation components, Central Processing Unit(s) (CPU), a Graphics Processing Unit(s) (GPU), chipset(s), memory module(s) such as: DRAM, SRAM, Z-RAM, TTRAM, ROM, PROM, EAROM, EPROM, EEPROM, Flash memory, FeRAM, MRAM, CBRAM, PRAM, SONOS, RRAM, NRAM, or other equivalent devices. In certain embodiments, electrical component(s) 114 are only high reliability components having a low expectation of failure. Circuit board 110 also comprises one or more connectors 304 and 306 (shown in FIG. 4) that enable the interconnection of a electronic component package described further below.

Fluid flow system 102 comprises a riser 106 and a pipe 104. Riser 106 is made from a thermally conductive material, and in certain embodiments may be made from a metal such as aluminum, copper, or any other equivalent material. In certain embodiments riser 106 supports the pipe 104. In other words pipe 104 is atop of riser 106. In other embodiments pipe 104 may be below riser 106. In other words upon assembly pipe 104 may be between electrical component(s) 114 and riser 106. Riser 106 and pipe 104 are in thermal contact with each other. In certain embodiments riser 106 and pipe 104 may be connected together using a thermally conductive connection material, such as solder, thermal solder epoxy, brazing material, thermally filled polymer adhesive, etc. Riser 106 may comprise feet 108 extending outwardly from riser 106. Feet 108 give riser 106 stability. On the underside of feet 108 there may be bored holes. Fasteners 118 may extend through circuit board via through holes 116, and fasten into the bored holes. Riser 106 may also comprise a groove 124 to aid in the proper retention or support of an electronic component package described further below.

Riser 106 may comprise angled surfaces 122. Angled surfaces 122 are at an acute angle to each other, and angle inwardly toward pipe 104. Angled surfaces 122 aid to properly align the electronic component packages 201 to the fluid flow system 102. In other words, tolerance build up is reduced when utilizing angled surfaces 122. Angled surfaces 122 are bisected by a curved surface that has a substantially similar radius as the outer radius of pipe 104. In this way, the curved surface provides a coincident surface to connect the riser 106 to the pipe 104. The relationships between angled surfaces 122 and the bisecting surface are described further in FIG. 6. When cooled fluid is moved within pipe 104, angled surfaces 122 alone or optionally in combination with another bisecting surface (i.e., a vertical surface connecting the bottom of riser 106 to the angled surfaces 122, etc.) may provide a relatively large area for cooling the electronic component package described further below. During operation the fluid is heated (heat transfer occurs) as the fluid passes electronic component package 201.

Riser 106 may also comprise a recess 126. Recess 126 may extend the length of riser 106, or alternatively recess 126 may extend at only certain locations upon riser 106. Recess 126 aids in the retention of the electronic component package described further below. When riser 106 is connected to circuit board 110, riser 106 adds stiffness to the circuit board. Riser 106 may also comprise one or more locating surface(s) 109. Locating surfaces 109 aid in positioning of the electronic component package during installation to the electronic enclosure.

Figure 2:
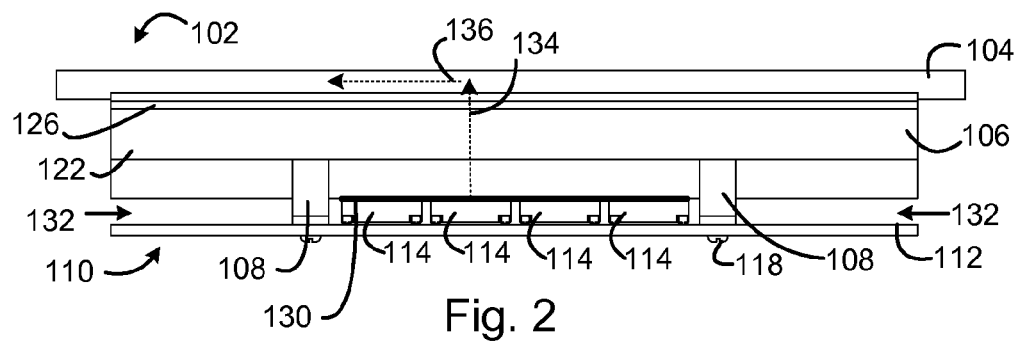
FIG. 2 depicts an assembled side view of the system of FIG. 1 according to an embodiment of the present invention.

A thermal interface material 128 (i.e., gel, paste, pad, pre-cured, two part gap fill, or another equivalent compliant thermally conductive material) may be placed upon electrical component(s) 114 or may be placed upon the underside of riser 106. Thermal interface material 128 is used to fill the gaps between riser 106 and electrical component(s) 114, in order to increase thermal transfer efficiency. Other configurations resulting in heat transfer are contemplated. Such configurations (e.g., utilizing thermal interface material 128, direct contact between riser 106 and electrical components 114, etc.), result in a thermal relationship 130 (FIG. 2). During operation of the electronic enclosure heat transfer occurs between riser 106 and electrical component(s) 114. Thermal relationship 130 allows for heat transfer between riser 106 and electrical component(s) 114. Circulation of cooled fluid in fluid flow system 102 allows for the removal of heat from the electronic enclosure.

Pipe 104 is configured to both hold and allow for the movement of fluid. Any liquid that is thermal conductive such as water, coolant, refrigerant, liquid metal, dielectric fluid, etc. is considered. Further pipe 104 may also hold and allow for the movement of gas, vapor or a combination of gas, vapor, and liquid. Pipe 104 is made of a thermally conductive material and in certain embodiments is made from copper, aluminum, stainless steel, etc. Fluid flow system 102 also comprises a pump (not shown) or other such equivalent liquid or gas moving device. In certain embodiments the liquid or gas moving device is internal to the electronic system. In other embodiments the liquid or gas moving device is external to the electronic system. Fluid flow system 102 also comprises a heat exchanger (not shown) or other such equivalent liquid or gas cooling device. In certain embodiments the liquid or gas moving device is internal to the electronic system. In other embodiments the liquid or gas moving device is external to the electronic system. The liquid or gas moving device and heat exchanger work together to aid in the movement and cooling of the liquid or gas internal to pipe 104. During operation of the electronic system cooled liquid or gas is moved through pipe 104. Heat from electronic components 114 and/or 206, and 208 (shown on FIG. 3) moves through riser 106 and/or pipe 104 to the liquid or gas in pipe 104. The heated liquid or gas is then moved by the liquid or gas moving device to the heat exchanger to be cooled. The cooled liquid or gas may be reintroduced to the fluid flow structure thereby creating a closed looped system.

In other embodiments fluid flow system 102 includes refrigeration components. Refrigeration is the process of removing heat from an enclosed space, or from a substance, and moving it to a place where it is unobjectionable. Refrigeration lowers the temperature of refrigerant used to cool the electronic enclosure. The refrigeration system may be for example a vapor-compression refrigeration cycle refrigeration system.

The vapor-compression refrigeration system uses a circulating liquid refrigerant as the medium which absorbs and removes heat from the electronic enclosure to be cooled. The vapor-compression systems comprises: a compressor, a condenser, an expansion valve, and an evaporator. Circulating refrigerant enters the compressor (after the refrigerant is heated within the electronic enclosure) in the thermodynamic state known as a saturated vapor and is compressed to a higher pressure, resulting in a higher temperature as well. The hot, compressed vapor is then in the thermodynamic state known as a superheated vapor. That hot vapor is routed through a condenser where it is cooled and condensed into a liquid by flowing through a coil or tubes with cool water or cool air flowing across the coil or tubes. This is where the circulating refrigerant rejects heat from the system and the rejected heat is carried away by either the water or the air.

The condensed liquid refrigerant, in the thermodynamic state known as a saturated liquid, is next routed through the expansion valve where it undergoes an abrupt reduction in pressure. That pressure reduction results in the adiabatic flash evaporation of a part of the liquid refrigerant. The auto-refrigeration effect of the adiabatic flash evaporation lowers the temperature of the liquid and vapor refrigerant mixture to where it is colder than the temperature of the electronic enclosure. The cold mixture is then routed through the fluid flow system 102. To complete the refrigeration cycle, the refrigerant vapor from the evaporator is again a saturated vapor and is routed back into the compressor.

Only a portion of circuit board 110 and fluid flow system 102 is shown in FIG. 1. However other arrangements are contemplated. Upon circuit board 110 there may be multiple fluid flow systems 102, with each fluid flow system 102 having individual heat exchangers and liquid moving devices. Alternatively the multiple fluid flow systems may be combined and interconnected where the combined fluid flow system may have one heat exchanger and one liquid or gas moving device. In yet another embodiment, fluid flow system 102 may be a single fixture, but may serpentine across circuit board 110 enabling cooling at multiple locations.

FIG. 2 depicts an assembled side view of the system of FIG. 1 according to an embodiment of the present invention. During operation of the electronic enclosure heat flows from electrical component(s) 114 as shown by element 134 and element 136 (fluid flow is as shown from right to left). Only a portion of riser 106 need contact circuit board 110. Such portion of riser 106 may be feet 108. Therefore an open volume 132 may exist between the riser 106 and circuit card 110. Other electrical components may be installed upon the circuit board in volume 132. If these electrical components generate a threshold amount of heat, the height between the circuit board 110 and riser 106 within volume 132 may be adjusted to create a thermal relationship between the top of those electrical component and riser 106.

Figure 3:
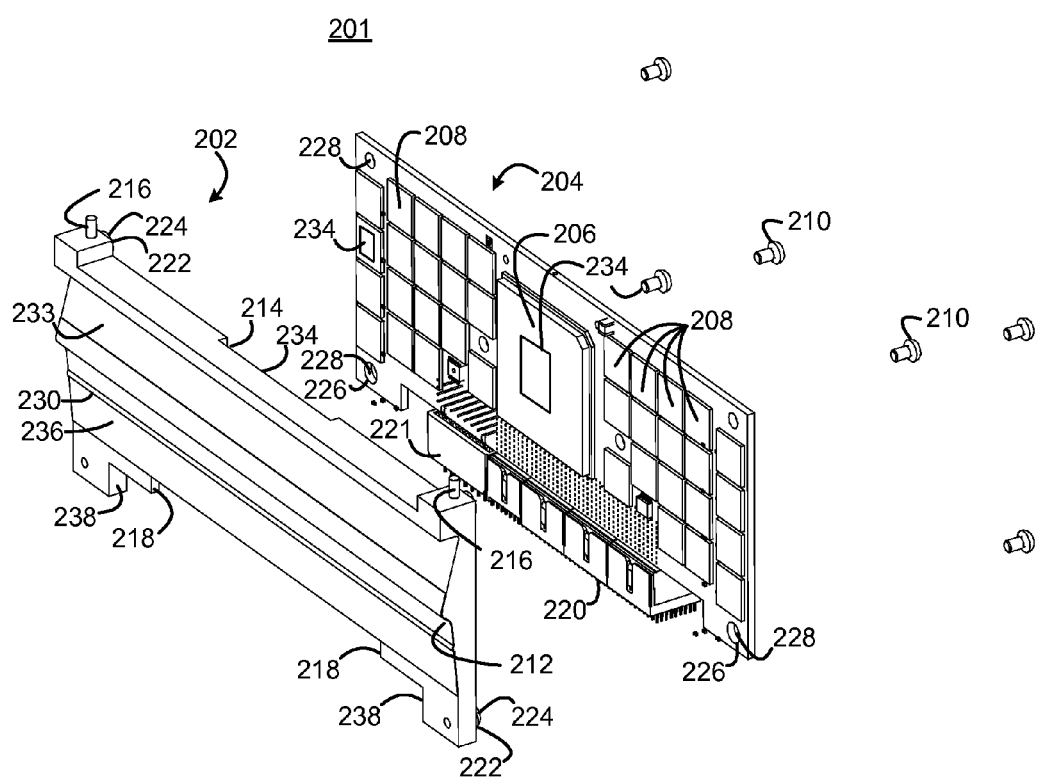
FIG. 3 depicts an exploded isometric view of an electronic component package according to an embodiment of the present invention.

FIG. 3 depicts an exploded isometric view of an electronic component package 201 according to an embodiment of the present invention. Electronic component package 201 comprises a circuit board assembly 204 and a heat spreader 202. Circuit board assembly 204 comprises at least an electrical component 206. In certain embodiments electrical component 206 is a CPU or GPU. Circuit board assembly 204 may also comprise a second type of electrical component(s) 208. In certain embodiments, electrical component(s) 208 are memory module(s), such as DRAMs. Connector(s) 220 may for functionally interconnect (allow for input/output signals) the circuit board 110 and the circuit board assembly 204. In other words connector(s) 220 may allow for the transfer of functional electronic signals. Connector(s) 221 may be a power connector allowing power to be supplied to electronic component package 201. In other words connector(s) 221 may allow for the transfer of power. Each type of connector 220 and 221 may utilize different interconnect systems according to purpose of the connector. Circuit board assembly 204 may also comprise through hole(s) 228 allowing fasteners 210 to pass through the circuit board assembly 204 and fasten to bored holes 224 in heat spreader 202. Circuit board assembly 204 may also comprise alignment holes 226. Alignment features 222 on heat spreader 202 fit within alignment holes 226, thereby properly aligning circuit board assembly 204 to heat spreader 202.

Heat spreader 202 is made (i.e., machined, etc.) from a thermally conductive material. In certain embodiments heat spreader 202 is made from aluminum, copper, or any such equivalent material. On a first surface, heat spreader 202 is configured to be in thermal contact with electrical components 206 and/or 208 of circuit board assembly 204. On a second opposing surface, heat spreader 202 is configured to be substantially coincident with the fluid flow system 102 when the electronic component package 201 is installed into the electronic enclosure.

Because electrical component(s) 208 and electrical component 206 may have a different height from the base of the circuit board, heat spreader 202 may comprise a recess 214. Recess 214 may be as wide, long, and deep as necessary to maintain thermal contact between the heat spreader 202 and electrical component(s) 208 and electrical component 206. In other words, the heat spreader 202 may be customized to mirror the height of the various electrical components utilized on the circuit board assembly 204. Heat spreader 202 may also comprise a clearance recess. A clearance recess may be utilized when the circuit board assembly comprises a sensitive component that does not needing cooling (and therefore no thermal relationship is needed with heat spreader 202). To allow for safe installation of the circuit board assembly 204 and heat spreader 202, a clearance recess may be incorporated into heat spreader 202. The clearance recess allows open space around the sensitive component decreasing the chance for damage to the sensitive component during installation. Electronic component package 201 may also comprise a thermal interface material 234. Thermal interface material 234 (i.e., gel, paste, pad, pre-cured, two part gap fill material, or another such equivalent compliant thermally conductive material) may be placed upon electrical component(s) 208 or electrical component 206 or may be placed upon appropriate locations on the backside of heat spreader 202. Thermal interface material 234 is used to fill the gaps between heat spreader 202 and electrical component(s) 208 and/or electrical component 206, in order to increase thermal transfer efficiency. Depending on the power density and the desired operating temperature, the thickness of the thermal interface material 234 on components 206 and 208 may be different. For example, it may be desirable to have as thin a layer as practical on component 206 and to have a thicker layer of thermal interface material 234 on components 208 to allow for height variations between the different components.

The opposing side of heat spreader 202 comprises a surface 236 that is configured to be substantially coincident to the angled surface 122 of the riser 106 upon installation of the electronic component package 201 to the electronic enclosure. Heat spreader 202 also comprises a curved surface 212. Curved surface 212 is configured to be substantially coincident to the outside of pipe 104 upon the installation of the electronic component package 201 to the electronic enclosure. Both the relationship between surface 236 and angled surface 122 and the relationship between curved surface 212 and the outside of pipe 104, when the electronic component package 201 is installed into the electronic enclosure, is shown in further detail in FIG. 6.

Heat spreader may also comprise an angled surface 233. Angled surface 233 results from removing material from heat spreader 202 where heat transfer would not likely occur. Since heat spreader 202 is made of thermally conductive material (typically metal), heat spreader 202 has a certain mass. In order to minimize the mass of heat spreader 202, those areas of heat spreader 202 where heat transfer is not expected may be removed.

Heat spreader 202 may also comprise a tab(s) 218. Tab(s) 218 are configured to fit into groove 124 (of riser 106) when the electronic component package 201 is installed into the electronic enclosure. The relationship between tab(s) 218 and groove(s) 124 is shown in further detail in FIG. 5. Heat spreader 202 may also comprise linking feature(s) 216. Linking feature(s) 216 are configured to aid in the latching or otherwise connection of a first electronic component package 201 to a second electronic component package 201. In certain embodiments linking feature(s) 216 are post(s). Each post enables a spring 302 (shown in FIG. 4) to apply a force between the first electronic component package 201 to the second electronic component package 201. The spring 302 applies force from one electronic component package to another electronic package. In other embodiments linking feature(s) 216 may support or otherwise attach a latch, cam, clamp, bracket, clasp, banding, fastener, or other equivalent device to one electronic component package. Like the spring, these features apply a connection force between the one electronic component package and the other electronic package. Heat spreader 202 may also comprise locating features 238. Locating features 238 provide proper location for electronic component package 201 when being installed into the electronic enclosure. Specifically, particular surfaces of locating features 238 are configured to be close to or substantially coincident to surfaces 109 of riser 106 during installation.

Heat spreader 202 may also comprise protuberance 230. Protuberance 230 is bump, budge, or other type of protrusion. Protuberance 230 may extend the length of heat spreader 202, or protuberance 230 may be located at certain locations upon riser 106. Protuberance 230 aids in the retention of the electronic component package described further below.

Figure 4:
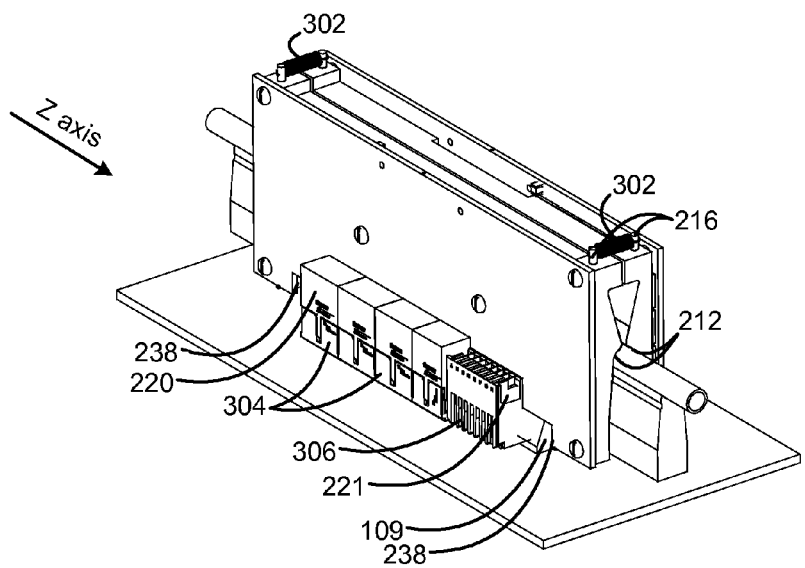
FIG. 4 depicts an isometric view of a first electronic component package and a second electronic component package assembled to a circuit board having a cooled fluid flow system, according to an embodiment of the present invention.

FIG. 4 depicts an isometric view of a first electronic component package 201 and a second electronic component package 201 assembled to circuit board 110 having a fluid flow system 102, according to an embodiment of the present invention. Circuit board 110 may also comprise a connector(s) 304 and/or connector 306. Connector 306 is configured to accept connector 221 on electronic component package 201. Connector 304 is configured to accept connector(s) 220 on electronic component package 201. The first electronic component package 201 and a second electronic component package 201 are arranged so that each respective heat spreader 202 contacts fluid flow system 102. Therefore heat transfer may occur on each side of fluid flow system 102.

When both the first electronic component package 201 and the second electronic component package 201 are installed a spring 302 applies a connection force. The connection force pulls each electronic component package towards one another, thereby forcing each electronic component package against the fluid flow system 102. If a compliant thermal interface material 404 (see FIG. 6) is used the force also compresses the thermal interface material. It is contemplated that a latch, cam, clamp, bracket, clasp, banding, fastener, or other equivalent device may be utilized to provide such connection force between the first electronic component package 201 and the second electronic component package 201. Spring 302 (or alternatively latch, cam, clamp, bracket, clasp, banding, fastener, or other equivalent device) should be easily removed or unlatched from the neighboring electronic component package 201 to allow for easy removal.

If a need for removal arises, for instance because electrical component 206 of the first electronic component package 201 has failed during operation of the electrical enclosure, the failed electronic component package is easily removed. In other words, the failed electronic component package does not interrupt either the operation of the functioning second electronic component package 201, or the cooling operation of fluid flow system 102. The electronic enclosure need not be powered down to facilitate electronic component package service, nor does operation of neighboring functional electronic component package need to be affected to facilitate electronic component package service. If service of an electronic component package is needed, the spring 302 or other connection force device is removed or otherwise unengaged. Consequently the particular electronic component package 201 may be lifted vertically away from circuit board 110 and removed from the electronic enclosure for service. A filler package may be installed as a replacement for the removed electronic component package. The filler may have a similar spring 302 or other connection force device to provide a connection force between the filler and the neighboring functional electronic component package. The functional electronic component package is therefore forced into contact with fluid flow system 102 therefore maintaining reliable cooling.

During installation of electronic component package 201, surface 109 is near or substantially coincident to locating feature(s) 238. Therefore electronic component package 201 is retained from substantial movement in the z-axis both during installation and operation.

Figure 5:
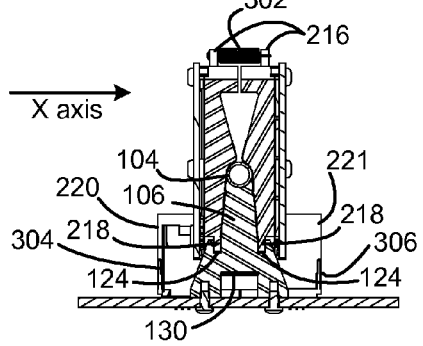
FIG. 5 depicts a cross section view of the system of FIG. 4, according to an embodiment of the present invention.

FIG. 5 depicts a cross section view of the first electronic component package 201 and the second electronic component package 201 assembled to circuit board 110 having a fluid flow system 102, according to an embodiment of the present invention. When both the first electronic component package 201 and the second electronic component package 201 are installed a spring 302 applies a connection force. The connection force pulls each electronic component package towards one another, thereby forcing each electronic component package against the fluid flow system 102. The connection force may create a stress/strain within connectors 220, 221, 304, and 306. The connection force may also create a stress/strain on the interconnection between the respective circuit boards and connectors 220, 221, 304, and 306. In order to minimize this stress/strain, the electronic component package 201 may comprise a tab(s) 218 and the riser 106 may comprise groove(s) 124. Tab(s) 218 are configured to fit within groove(s) 124 upon the installation of electronic component package 201 to the electronic enclosure. Groove(s)

124 prevent movement of electronic component package 201 in the x-axis. Groove(s) 124 also prevent the rotation of electronic component package 201 about the z-axis. In other words, rotational forces and moments created by forces in the x-axis are not absorbed or transferred into connectors 220, 221, 304, and 306 but are absorbed or transferred into tab(s) 218 and groove(s) 124.

Figure 6:
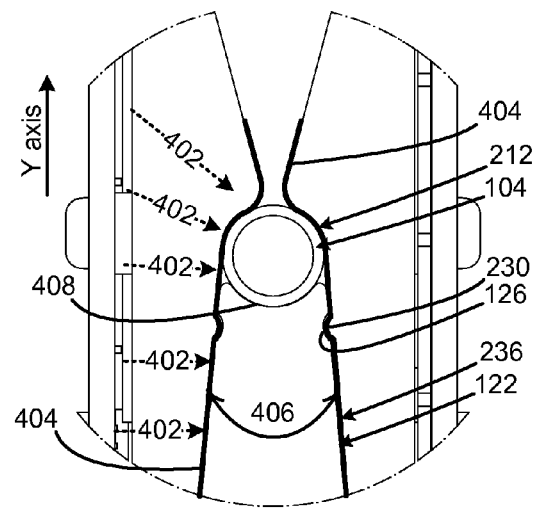
FIG. 6 depicts a detailed view of a side profile of the system of FIG. 4, according to an embodiment of the present invention.

FIG. 6 depicts a detailed view of a side profile of the first electronic component package 201 and the second electronic component package 201 assembled to circuit board 110 having a fluid flow system 102, according to an embodiment of the present invention. Recess 126 may extend the length of riser 106, or recess 126 may extend at only certain locations upon riser 106. Recess 126 aids in the retention of the electronic component package. Protuberance 230 is bump, budge, or other equivalent type of protrusion. Protuberance 230 may extend the length of heat spreader 202, or protuberance 230 may be at only certain locations upon riser 106. The protuberance 230 and recess 126 are configured so that protuberance 230 fit into recess 126 upon installation of electronic component package 201. When both the first electronic component package 201 and the second electronic component package 201 are installed a spring 302 applies a connection force. The connection force pulls each electronic component package towards one another, thereby forcing each electronic component package against the fluid flow system 102. The connection force urges protuberance 230 into recess 126. Fitting protuberance 230 into recess 126 aids to prevent movement of the electronic component package in the y-axis. The connection force also compresses thermal interface material 404.

A coincident relationship exists during operation or installation between surface 236 and surface 122. Surface 236 may be in contact with, or near contact with surface 122. Due to material and manufacturing variations it may be unlikely every location of surface 236 is coincident with surface 122. In order to fill these small gaps a compliant thermal interface material 404 may be utilized. Thermal interface material 404 (i.e., gel, paste, pad, pre-cured or two part gap fill material, compliant metal, or another such equivalent compliant thermally conductive material) may be placed upon heat spreader 202 or may be placed upon the fluid flow system 102. Thermal interface material 404 is used to fill the gaps between fluid flow system 102 and heat spreader 202, in order to increase thermal transfer efficiency.

A coincident relationship exists during operation or installation between angled surface(s) 122 and surface 236 of heat spreader 202. Upon riser 106 angled surfaces 122 are at an acute angle 406 to each other, angling inwardly toward pipe 104. Angled surfaces 122 aid with proper alignment and tolerance buildups concerning the insulation and fit of the electronic component package 201 to the circuit board 110. Small x-axis and y-axis tolerance variations are absorbed by the small horizontal difference created by the angle 406. Angled surfaces 122 are bisected by a curved surface 408 that has a substantially similar radius as the outer radius of pipe 104. In this way, the curved surface 408 provides a coincident surface to connect the riser 106 to the pipe 104.

Heat transfer 402 occurs between the heat spreader 202 and fluid flow system 102. Heat transfer 402 is approximately perpendicular to the installation direction of electronic component package 201. In other words, heat transfer 402 occurs in a direction that is approximately perpendicular to the actuation of the electrical connector(s) of the electronic component package 201 to the electrical connectors upon circuit board 110.

Figure 7:
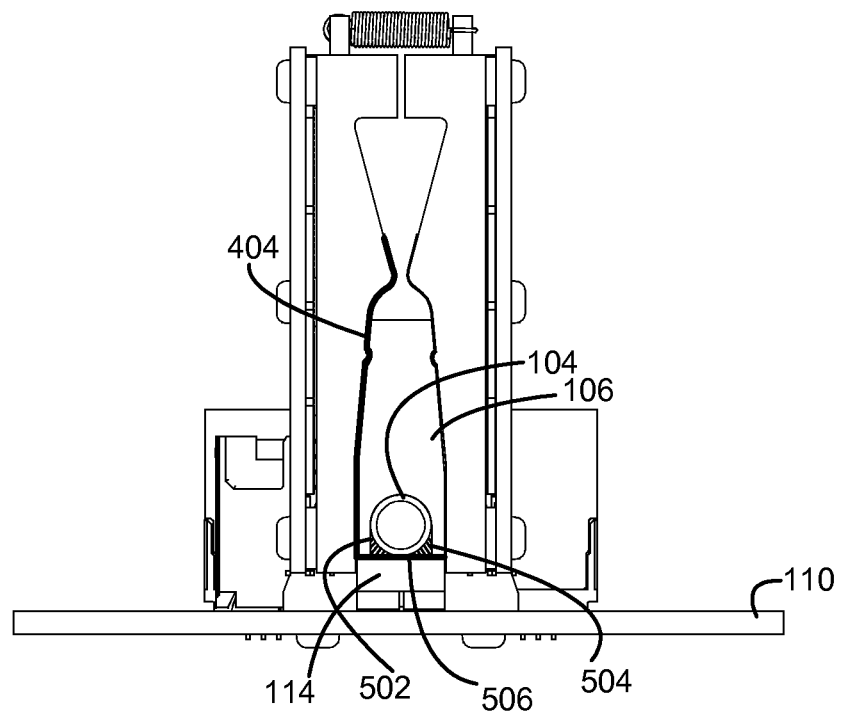
FIG. 7 depicts an alternative configuration of the fluid flow system, according to an embodiment of the present invention.

FIG. 7 depicts an alternative configuration of the fluid flow system 102, according to an embodiment of the present invention. FIG. 7 depicts pipe 104 on the underside of riser 106. In other words, pipe 104 is near to circuit board 110 and may be in between circuit board 110 and riser 106. The present configuration of fluid flow system 102 is useful when electrical component 114 generates more heat that electrical components 206 and/or electrical components 208. By moving pipe 104 toward electrical component(s) 114 the distance heat must travel to the cooled pipe 104 is decreased, resulting in increased cooling. Riser 106 may comprise a recess 502. Recess 502 is a cut out or other removed section of riser 106 configured so that pipe 104 may fit within riser 106. Recess 502 may also be configured so that the outer diameter of pipe 104 is tangential to the bottom surface of riser 106. A space(s) may result after pipe 104 is fit into recess 502. Such space(s) may be filled with a thermally conductive material 504 (gel, paste, filled polymer, procured or two part thermal gap fill material, metal, solder, epoxy, etc.). In certain embodiments thermally conductive material 504 max affix pipe 104 to riser 106. After the application of thermally conductive material 504, the bottom surface of riser 106 may be smoothed to create a substantially flat surface 506. A substantially flat surface 506 allows for more reliable and greater contact between electrical components 114 and the riser 106, resulting in better heat transfer. A thermal interface material 128 may also be applied to the substantially flat surface 506.

In certain embodiments pipe 104 need not contact or otherwise form a thermal relationship directly with heat spreader 202. Consequently heat spreader may only contact or form a thermal relationship with riser 106. In the present embodiments eliminating the contact between pipe 104 and heat spreader 202 may result in tolerance improvements and higher reliability of contact, or the formation of a thermal relationship, between riser 106 and heat spreader 202.

It is to be understood that the present invention, in accordance with at least one present embodiment, includes elements that may be implemented on at least one electronic enclosure, such as general-purpose server running suitable software programs.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

The invention claimed is:

1. An electronic apparatus, comprising,
a motherboard,
a fluid cooled heat sink projecting above a first surface of said motherboard;
a first and a second electronic component package removably mounted to said motherboard at opposite sides of said fluid cooled heat sink, each said first and second electronic component package having at least one respective heat generating electronic component, each said first and second electronic component package being thermally coupled to said fluid cooled heat sink when mounted to said motherboard to provide cooling of said first and second electronic component packages;
wherein said first electronic component package is independently removable from said motherboard without thermally decoupling said second electronic component package from cooling fluid of said fluid cooled heat sink, and said second electronic component package is independently removable from said motherboard without thermally decoupling said first electronic component package from cooling fluid of said fluid cooled heat sink.

2. The electronic apparatus of claim 1, wherein the fluid cooled heat sink comprises:
a riser, the bottom of the riser fixedly and directly connected to the motherboard and the top of the riser thermally connected to a pipe for transmitting the cooling fluid.

3. The electronic apparatus of claim 2, wherein the riser comprises a respective recess on each side thereof facing a respective electronic component package, and each electronic component package further comprises a respective protrusion, wherein the respective recess accepts the respective protrusion aiding in the retention of the respective electronic component package to the motherboard.

4. The electronic apparatus of claim 2, wherein the riser comprises a first angled surface at an acute angle to a second angled surface, the first angled surface and second angled surface bisected by a symmetrical curved surface having a substantially similar radius as the outer radius of the pipe.

5. The electronic apparatus of claim 1, wherein each said first electronic component package and said second electronic component package comprises a respective circuit board assembly mounting the at least one respective heat generating electronic component and a respective heat spreader thermally coupled to the at least one respective heat generating electronic component, the heat spreader being substantially coincident to said fluid cooled heat sink.

6. The electronic enclosure of claim 5, wherein the first electronic component package further comprises a compliant thermal interface material layered upon at least a portion of the first heat spreader, and wherein the second electronic component package further comprises a compliant thermal interface material layered upon at least a portion of the second heat spreader.

7. An electronic apparatus, comprising,
a motherboard, said motherboard having at least one heat generating electronic component mounted thereto;
a fluid cooled heat sink attached to said motherboard, said fluid cooled heat sink being thermally coupled to said at least one first heat generating electronic component mounted to said motherboard to provide cooling thereto;
an electronic component package removably mounted to said motherboard, said electronic component package having at least one second heat generating electronic component, said electronic component package being thermally coupled to said fluid cooled heat sink when mounted to said motherboard to provide cooling of said electronic component package;
wherein said electronic component package is independently removable from said motherboard without thermally decoupling said at least one first heat generating electronic component from cooling fluid of said fluid cooled heat sink.

8. The electronic apparatus of claim 7, comprising:
a first and a second electronic component package removably mounted to said motherboard at opposite sides of said fluid cooled heat sink, each said first and second electronic component package having at least one respective heat generating electronic component, each said first and second electronic component package being thermally coupled to said fluid cooled heat sink when mounted to said motherboard to provide cooling of said first and second electronic component packages;
wherein said first electronic component package is independently removable from said motherboard without thermally decoupling said at least one first heat generating electronic component from cooling fluid of said fluid cooled heat sink and without thermally decoupling said second electronic component package from cooling fluid of said fluid cooled heat sink, and said second electronic component package is independently removable from said motherboard without thermally decoupling said at least one first heat generating electronic component from cooling fluid of said fluid cooled heat sink and without thermally decoupling said first electronic component package from cooling fluid of said fluid cooled heat sink.

9. The electronic apparatus of claim 8, further comprising a means for applying a force, the force applying means connected to the first electronic component package and the second electronic component package, the force applying means forcing the first electronic component package and the second electronic component package into contact with the fluid cooled heat sink, the means for applying a force being selected from a group comprising of a latch, cam, clamp, bracket, clasp, banding, fastener, and spring.

10. The electronic apparatus of claim 7, wherein the riser comprises a recess on a side thereof facing said electronic component package, and said electronic component package further comprises a protrusion, wherein the recess accepts the protrusion aiding in the retention of the electronic component package to the motherboard.

11. The electronic apparatus of claim 7, wherein the riser comprises a first angled surface at an acute angle to a second angled surface, the first angled surface and second angled surface bisected by a symmetrical curved surface having a substantially similar radius as the outer radius of the pipe.

12. The electronic apparatus of claim 7, wherein each said electronic component package comprises a circuit board assembly mounting the at least one second heat generating electronic component and a heat spreader thermally coupled to the at least one second heat generating electronic component, the heat spreader being substantially coincident to said fluid cooled heat sink.

13. The electronic enclosure of claim 12, wherein the electronic component package further comprises a compliant thermal interface material layered upon at least a portion of the heat spreader.

* * * * *